United States Patent [19]
van Eijck

[11] 4,064,461
[45] Dec. 20, 1977

[54] RECEIVER INCLUDING A STATION FINDING CIRCUIT

[75] Inventor: Gustavus Lambertus Petrus van Eijck, Eindhoven, Netherlands

[73] Assignee: U.S. Philips Corporation, Briarcliff Manor, N.Y.

[21] Appl. No.: 628,909

[22] Filed: Nov. 5, 1975

[30] Foreign Application Priority Data

Jan. 14, 1975 Netherlands .......................... 7500396

[51] Int. Cl.² ............................................. H04B 1/32
[52] U.S. Cl. .................................... 325/470; 325/469; 325/468
[58] Field of Search .......................... 325/470, 469, 468

[56] References Cited

U.S. PATENT DOCUMENTS

| | | | |
|---|---|---|---|
| 3,821,651 | 6/1974 | Fathauer | 325/470 |
| 3,824,475 | 7/1964 | Pflasterer | 325/470 |
| 3,913,020 | 10/1975 | Van Anrooy | 325/470 |
| 3,916,319 | 10/1975 | Hawley | 325/470 |

Primary Examiner—Harold I. Pitts
Attorney, Agent, or Firm—Frank R. Trifari; Henry I. Steckler

[57] ABSTRACT

A receiver employs automatic wave-range switching. The wave-range information is used to have a station finding circuit run through the unwanted wave-ranges at a fast rate and run through the desired wave-range at a comparatively slow rate. This is done by applyng counting pulses having a switchable frequency to a counter governing the finding action.

4 Claims, 2 Drawing Figures

RECEIVER INCLUDING A STATION FINDING CIRCUIT

BACKGROUND OF THE INVENTION

1. Field of the Invention

The invention relates to a receiver including a station finding circuit, comprising a tuning information storage circuit constituted as a counter, a counting signal input of said counter being coupled to an output of a pulse generator, a converting circuit being coupled to an output circuit of said counter for converting tuning information present in the counter into wave-range information which can be derived from an output circuit of the converting circuit.

2. Description of the Prior Art

Such a receiver is known from U.S. Pat. No. 3,654,557 in which the tuning information storge circuit constituted as a counter has an output circuit with which the receiver can be tuned successively to a number of frequencies when pulses are applied to the counter. The output circuit in this specification serves to select and switch on one potentiometer of a group of potentiometers each of which is capable of supplying a tuning voltage for the tuning receiver to a certain frequency. Furthermore this receiver includes an automatic wave-range switching circuit which uses wave-range information which can be derived from the output circuit of the counter. When a finding action is set in train pulses are applied to the counter until a desired station is tuned to. These pulses are obtained from a pulse generator capable of generating pulses at a certain frequency. The finding action is over a number of wave-ranges, which may result in a rather long-lasting finding action when the desired tuning frequency is in a wave-range which is completely different from that of the frequency to which the receiver was tuned.

An object of the invention is to considerably shorten the duration of the finding action.

SUMMARY OF THE INVENTION

According to the invention a receiver of the kind described in the preamble is characterized in that a comparison circuit is coupled to the output circuit of the converting circuit, an operating circuit being furthermore coupled to said comparison circuit, said operating circuit including a finding command switch for each wave-range, an output of the comparison circuit being coupled to a finding speed change-over switch with which the frequency of the pulse generator output can be changed so that counter positions not corresponding to a selected wave-range can be run through quickly during a finding action and counter positions corresponding to the selected wave-range can be run through at a slower rate. The frequency of the pulse generator output can be selected to be such that counter positions not corresponding to the selected wave-range are run through within such a short time that the person operating the receiver does not notice that this is happening. In the case of a receiver having an automatically operating finding action reponsive to an identification signal such as, for example, a field strength-dependent voltage, it can be ensured that this signal cannot be produced quickly enough in an unwanted wave-range to automatically terminate the finding action in said wave-range.

The counter may serve, for example, to switch on a desired tuning voltage or to supply digital information to a frequency synthesizer or a digital-to-analog converter. If desired, the counter may not only be fed with tuning data by a pulse generator, but also, for example, directly from an operating device.

The invention will now be described with reference to the drawing which shows one embodiment.

DESCRIPTION OF THE PREFERRED EMBODIMENT

Figure 1:
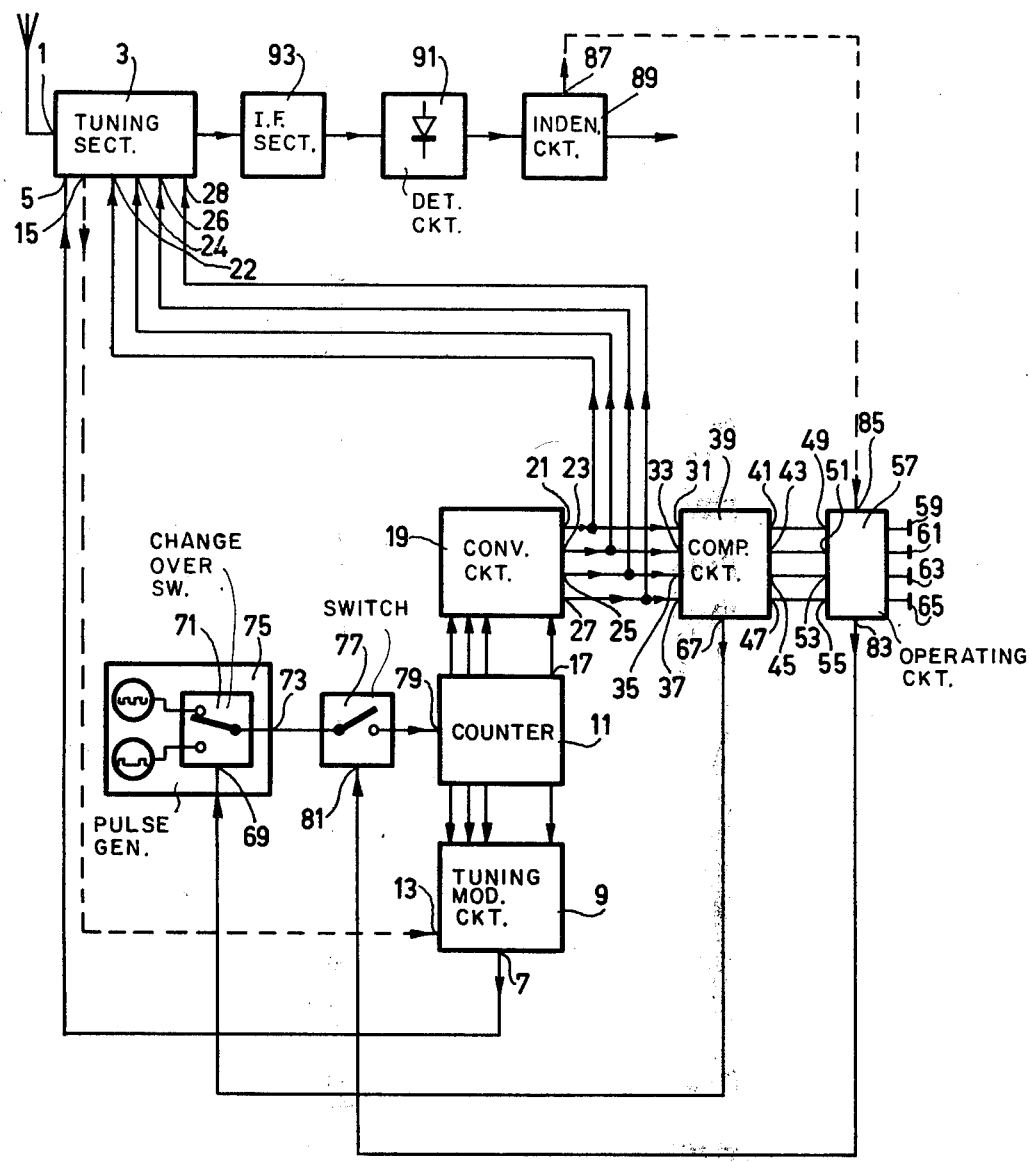
FIG. 1 shows a block-schematic diagram of a receiver according to the invention.

In FIG. 1 a signal originating, for example from an aerial is applied to an input 1 of a tuning section 3 of a receiver. A tuning voltage which is obtained from an output 7 of a tuning information modifying circuit 9 coupled to a number of outputs of a counter 11 is applied to a tuning signal input 5 of the tuning section 3.

The counter 11 serves as a tuning information store. The tuning information modifying circuit 9 may include, for example, a potentiometer circuit and a gating circuit with which a desired output of the potentiometer circuit can be connected to the output 7 or it may include a digital-to-analog converter. Alternatively, the tuning information modifying circuit may form part of, for example, a frequency synthesizer. In that case a signal originating from an output 15 of the tuning section must be applied to an input 13 thereof so that its frequency or phase can be measured in the tuning information modifying circuit 9.

Furthermore the counter 11 has an output circuit 17 which is coupled to a converting circuit 19. In the converting circuit 19 the tuning information originating from the counter such as, for example, a frequency or channel number is converted into wave-range information. This is effected with the aid of gating circuits which only supply an output signal when the relevant frequency or channel number corresponds to a certain wave-range. Four outputs 21, 23, 25, 27 associated with an output circuit of the change-over circuit each correspond to one wave-range.

The outputs 21, 23, 25, 27 of the converting circuit 19 are connected to wave-range signal inputs 22, 24, 26, 28 of the tuning sections 3 and to inputs 31, 33, 35, 37 of a comparison circuit 39. A wave-range associated with the tuning information present in the counter 11 is selected in the tuning section 3 with the aid of the signals at the inputs 22, 24, 26, 28. The number of wave-ranges that can be selected is in this case four, but any other desired number may of course be provided for.

Furthermore the comparison circuit 39 has four inputs 41, 43, 45, 47 connected to corresponding outputs 49, 51, 53, 55 of an operating circuit 57. A desired wave-range can be selected with the aid of four finding command switches 59, 61, 63, 65 forming part of the operating circuit 57.

When the selected wave-range does not correspond to the wave-range derived from the counter information, or when the counter is in a position corresponding to a frequency beyond a wave-range, the comparison circuit 39 provides a signal at an output 67, which signal is applied to an operating signal input 69 of a finding speed change-over switch 71 so that pulses having a high frequency are applied to an output 73 of a pulse generator 75 with which the finding speed change-over switch 71 is associated. When the selected wave-range does correspond to the wave-range derived from the counter information, the finding speed change-over switch 71 is set to such a position that pulses of a comparatively low frequency occur at the output 73. This change-over of the frequency can be obtained, for example, by changing a time constant or by varying the factor by which a frequency is divided or by switching-on a further generator.

The output 73 of the pulse generator 75 is connected through a switch 77 to a counting signal input 79 of the counter 11. When the switch 77 is closed, the tuning information in counter 11 is varied because pulses originating from the pulse generator 75 are applied to its counting signal input. The switch 77 is closed when a finding signal originating from an output 83 of the operating circuit 57 is applied to an operating signal input 81 thereof. This finding signal occurs when one of the finding command switches 59, 61, 63, 65 is operated. In a receiver having an automatic finding circuit this finding signal is furthermore dependent on an identification signal which can be applied to an input 85 of the operating circuit 57. This identification signal originates from an output 87 of an identification circuit 89 an input of which is connected to an output of a detection circuit 91 which receives a signal from the tuning section 3 through an intermediate frequency section 93. This identification signal may be, for example, a field strength-dependent signal, a detected pilot signal or a detected signal pattern which may occur when the tuning section 3 is tuned to a desired station.

When counting pulses having a high frequency are applied to the input 79 of the counter, which will be the case if the wave-range associated with the tuning information in the counter 11 does not correspond to the wave-range selected by means of the operating circuit 57, the tuning information in this counter changes at a high speed until the tuning information in the counter does correspond to the desired wave-range, at which point the counting signal frequency is decreased and the counter continues to count at a much slower rate. The selected wave-range is therefore run through at a much slower rate than the non-selected wave-ranges. The rate at which the non-selected wave-ranges are run through is preferably chosen to be so high that the person operating the receiver substantially does not notice it happening and so high that the identification signal cannot be produced at the input 85 of the operating circuit 57 if an automatic station finding circuit is provided. It is alternatively possible to suppress the identification signal with the aid of the output signal from the comparison circuit during the high speed finding action.

Figure 2:
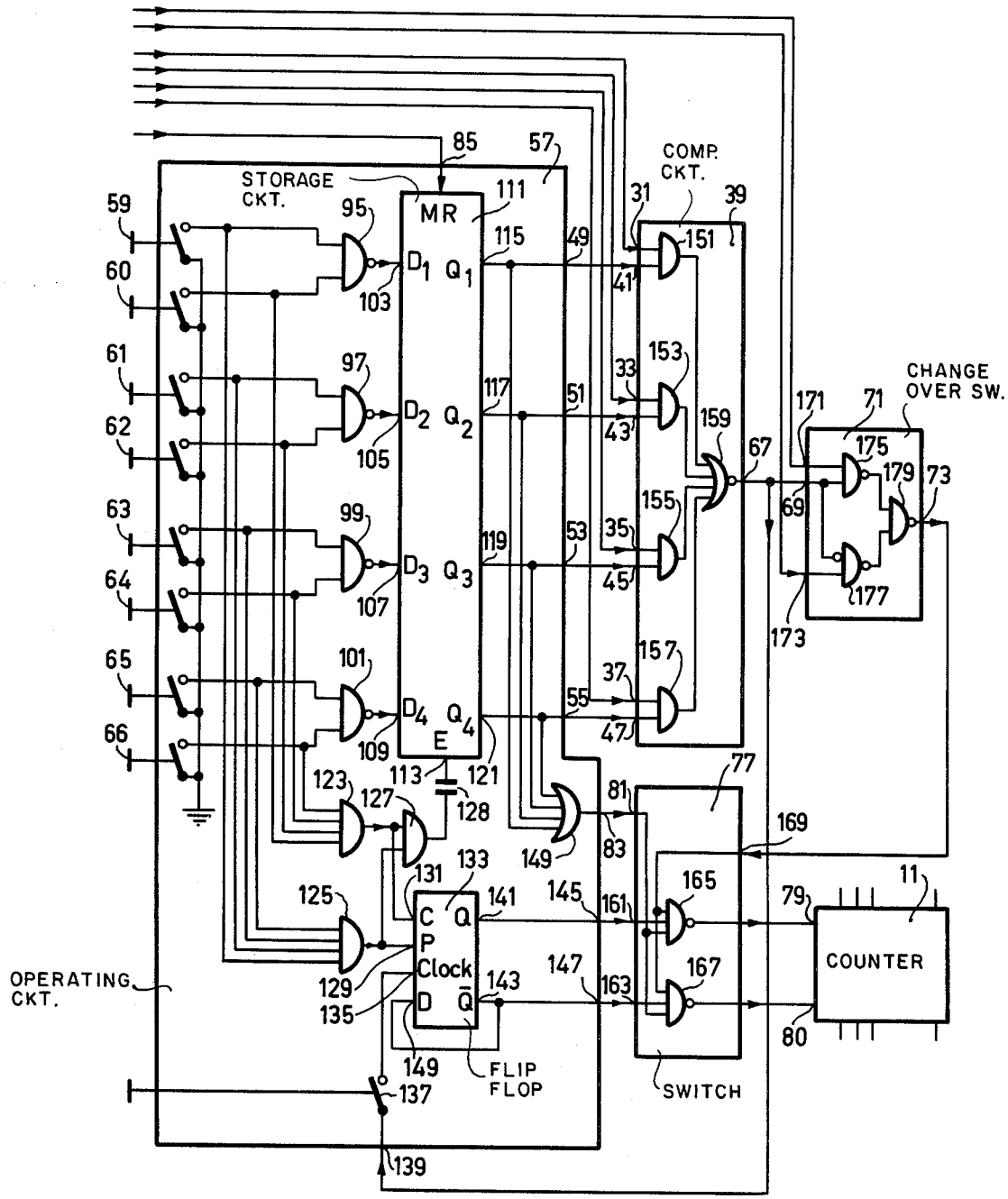
FIG. 2 shows a block-schematic diagram of a possible embodiment of part of a receiver according to the invention.

In a station finding circuit having two finding directions the counting direction of the counter 11 must be switcheable and a counting command switch is preferably used for each finding direction and for each wave-range, as is shown in the embodiment of FIG. 2. A further possibility is, for example, to use separate operating members for the selection of the finding direction and the wave-range.

In FIG. 2 corresponding parts have the same reference numerals as in FIG. 1. FIG. 2 illustrates an embodiment of an operating circuit 57, a comparison circuit 39, a finding speed change-over switch 71 and a switch 77. The circuit is suitable for producing a signal which can increase the position of the counter 11, which signal is applied to the input 79 thereof, and for producing a signal which can decrease the counter position, which signal is applied to an input 80 of the counter 11. The counter 11 must be capable of counting in both directions.

The operating circuit 57 not only includes the finding command switches 59, 61, 63 and 65 serving to give a certain finding direction in each wave-range, but also four finding command switches 60, 62, 64 and 66 serving to give the other finding direction, each of the latter switches corresponding to one wave-range.

The finding command switches 59 to 66 are each connected to ground at one end and to two gating circuits at the other end.

One gating circuit comprises four inverting AND (NAND) gates 95, 97, 99, 101 whose inputs are connected to the finding command switch pairs 59, 60; 61, 62; 63, 64 and 65, 66, respectively, each pair being associated with one wave-range, and whose outputs are connected to inputs 103, 105, 107 and 109, respectively, of a storage circuit 111 of the so-called 4-bit latch type, for example type 9314, which inputs are each coupled to a storage element. These elements apply signals to outputs 115, 117, 119 and 121 respectively when a registering signal is applied to a further input 113. The storage elements can be brought to the reset condition simultaneously by application of the identification signal to the input 85 (MR) so that no signal is then applied to the inputs 79 and 80 of the counter 11 and a finding action is discontinued as will be described hereinafter.

The other gating circuit comprises two AND gates 123, 125. The four inputs of the gate 123 are connected to the finding command switches 60, 62, 64 and 66 corresponding to one and the same finding direction. The four inputs of the gate 125 are connected to the finding command switches 59, 61, 63 and 65 corresponding to the other finding direction. The outputs of the gates 123, 125 are each connected to an input of an AND gate 127 an output of which is coupled through a capacitor 128 to the registering signal input 113 of the store 111. The outputs of the gates 123, 125 are furthermore connected to set (P) and reset (C) inputs 129 and 131 respectively of a flipflop circuit 133 of the so-called edgetriggered D-type, for example type SN 7474, a clock signal input 135 of which is connected through a finding type switch 137 to a finding direction inverter signal input 139. The flipflop circuit 133 has two outputs 141 (Q), 143 (Q̄) which apply signals which are inverted relative to each other to outputs 145, 147 of the operating circuit 57. Furthermore the output 143 is connected to a data input 149 of the flipflop circuit 133. As a result the signal value at the output 143 is transferred to the output 141 if a positive pulse occurs at the input 135, so that the signal state at the outputs 141, 143 is changed whenever a pulse occurs.

The outputs 115, 117, 119 and 121 of the storage circuit 111 are connected to the outputs 49, 51, 53, 55 of the operating circuit 57 and to the four inputs of an OR gate 149 whose output is connected to the output 83 of the operating circiut 57.

The comparison circuit 39 includes four AND gates 151, 153, 155, 157 whose inputs are connected to the inputs 31, 41; 33, 43; 35, 45 and 37, 47, respectively, and whose outputs are connected to the inputs of an inverting OR (NOR) gate 159 whose output constitutes the output 67 of the comparison circuit 39.

Two inputs 161, 163 of the switch 77 are connected to the outputs 145, 147 of the operating circuit 57 and to inputs of inverting AND (NAND) gates 165 and 167 a further input of each of which is connected to the input 81 and a third input of each of which is connected to an input 169 which is connected to the output 73 of the change-over switch 71. The outputs of the gates 165, 167 are connected to the inputs 79, 80 of the counter 11.

The change-over switch 71 has an input 171 to which a pulse signal having a high frequency is applied and an input 173 to which a pulse signal having a low frequency is applied. The inputs 69 and 171 are connected to the inputs of an inverting AND (NAND) gate 175 and the input 173 is connected to an input of an inverting AND gate 177 another input of which is connected through an inversion circuit to the input 69. The outputs of the gates 175, 177 are connected to the inputs of an inverting AND (NAND) gate 179 whose output is connected to the output 73 of the change-over switch 71.

The operation of the circuit is as follows. When none of the finding command switches 59 to 66 is closed, all inputs of the gates 95, 97, 99 and 101 and the gates 123 and 125 are high so that the outputs of the gates 95, 97, 99 and 101 are low and those of the gates 123 and 125 are high. The output of the gate 127 is then also high and the flipflop circuit 133 has an output state which was determined by a previous manipulation. When one of the finding command switches, for example 59, is closed, the gate 125 supplies a signal which is low. The output of the gate 95 will then be high and hence also the input 103 of the storage circuit 111. The output of the gate 127 will then also be low and this low output is coupled through the capacitor 128 to the input 113 until the capacitor 128 has adjusted its charge. While this is happening the inputs of the storage circuit are connected to their storage elements and the output 115 will be high and the outputs 117, 119, 121 will be low. As a result the output of the gate 149 will be high. Furthermore the flipflop circuit 133 is set at the input 129 by the decreasing signal applied thereto and the output 141 thereof will be high while the output 143 will be low. As a result the output of the gate 165 may become low and that of the gate 167 will remain high. During the occurrence of negative pulses at the input 169 of the switch 77 the gate 165 will apply positive pulses to the input 79 of the counter 11 which then runs, for example, in the positive direction.

The frequency with which the pulses occur at the output 73 of the change-over switch 71 depends on the value of the signal at the operating signal input 69. When this value is high, the gate 177 is blocked and the gate 175 is conducting for the pulse signal at the input 171. The gate 179 passes on this signal because the output of the gate 177 is high. The frequency of the signal at the output 73 is then high and a fast finding action then occurs because the counter 11 operates at a fast rate.

The operating signal at the input 69 results from the comparison circuit 39 comparing the information in the storage circuit 111 with that at the inputs 31, 33, 35, 37 which is information about what wave-range the receiver is being tuned to by the counter 11. When this does not correspond to the range selected through the finding command switches, all gates 151, 153, 155, 157 will produce a signal having a low value and the output of the gate 159 will be high so that the counter 11 will operate at a very fast rate as described above. When the counter 11 has reached a position corresponding to the desired wave-range, the inputs 31 and 41 will both be high and also the output of the gate 151 will be high so that the output of the gate 159 becomes low, the gate 175 is blocked and the gate 177 passes on the pulse signal from the input 173 to the gate 179 so that a pulse signal having a low frequency occurs at the output 73.

The finding direction may be reversed by bringing the flipflop circuit 133 to a different state. This can be effected by operating one of the finding command switches 60, 62, 64, 66 so that the output of the gate 123 becomes low and that of the gate 125 remains high resulting in the flipflop circuit 133 being reset, the output 141 becoming low and the output 143 becoming high so that the gate 167 can apply pulses to the input 80 of the counter 11 and the gate 165 is blocked.

As explained hereinbefore the output 67 of the comparison circuit 39 is low when the counter 11 runs through the desired wave-range and is high when it runs through an unwanted wave-range. Thus a positive-going signal occurs at this output 67 and hence also at the finding direction reversal signal input 139 of the operating circuit 57 when the limits of this wave-range are reached. If desired, this signal may be applied to the clock signal input 135 of the flipflop circuit 133 when the finding type switch 137 is closed. The flipflop circuit wil then change its state every time a limit of the desired wave range is reached so that the finding direction changes and the counter 11 only runs through the desired wave-range in the forward and reverse directions until a signal occurs at the input 85 of the storage circuit 111, which signal indicates that a suitable station has been received. The occurence of this signal will cause all outputs 115, 117, 119 and 121 to become low, and hence the output of the gate 149, resulting in the gates 165, 167 being blocked and the counter 11 being stopped. The counter of course also stops when the finding type switch 137 is not closed. The difference is that the counter then tunes the receiver in the same direction every time so that after reaching the end of the desired wave-range the other ranges are first run through at a fast rate in the same direction whereafter the desired wave-range is slowly run through again in said direction.

Although the comparison circuit in the above-described embodiment has a number of input pairs corresponding to the number of wave-ranges to be selected, this need not always be the case. The wave-range information and the information originating from the finding command switches may, if desired, be applied in a coded form to the comparison circuit so that the number of inputs can be greatly reduced.

Furthermore it will be evident that the finding type switch 137 may be omitted, if desired, or replaced by a direct connection.

What is claimed is:

1. A station finding circuit comprising a pulse generator having an output, a tuning information storage circuit including a counter having a counting signal input coupled to said generator output, a converting circuit coupled to an output circuit of the counter for converting tuning information present in the counter into wave-range information which can be derived from an output circuit of the converting circuit, a comparison circuit having inputs coupled to the output circuit of the converting circuit and an output, an operating circuit coupled to said comparison circuit, said operating circuit including a finding command switch for each wave-range, a finding speed change-over switch means coupled to said comparison circuit output for changing the frequency of the pulse generator output so that counter positions not corresponding to a selected wave-range are run through at a fast rate during a finding action and counter positions corresponding to the selected wave-range can be run through at a comparatively slow rate.

2. A station finding circuit as claimed in claim 1, further comprising a finding direction reversal circuit means coupled to the output of the comparison ciruit for reversing the finding direction at the ends of the selected wave range.

3. A receiver as claimed in claim 2, wherein the finding direction reversal circuit can be switched off.

4. A receiver including a station finding circuit as claimed in claim 1.

* * * * *